(12) United States Patent
Yang et al.

(10) Patent No.: US 12,256,592 B2
(45) Date of Patent: Mar. 18, 2025

(54) ORGANIC LIGHT EMITTING DEVICE, METHOD OF MANUFACTURING SAME, AND DISPLAY PANEL

(71) Applicants: Chengdu BOE Optoelectronics Technology Co., Ltd., Sichuan (CN); BOE Technology Group Co., Ltd., Beijing (CN)

(72) Inventors: Huiyun Yang, Beijing (CN); Xiaojin Zhang, Beijing (CN); Haiyan Sun, Beijing (CN)

(73) Assignees: Chengdu BOE Optoelectronics Technology Co., Ltd., Sichuan (CN); BOE Technology Group Co., Ltd., Beijing (CN)

( * ) Notice: Subject to any disclaimer, the term of this patent is extended or adjusted under 35 U.S.C. 154(b) by 815 days.

(21) Appl. No.: 17/509,788

(22) Filed: Oct. 25, 2021

(65) Prior Publication Data
US 2022/0131101 A1   Apr. 28, 2022

(30) Foreign Application Priority Data
Oct. 26, 2020  (CN) .......................... 202011156775.X

(51) Int. Cl.
H01L 51/50 (2006.01)
H01L 51/56 (2006.01)
H10K 50/12 (2023.01)
H10K 71/00 (2023.01)
H10K 101/30 (2023.01)
H10K 102/00 (2023.01)

(52) U.S. Cl.
CPC .......... H10K 50/121 (2023.02); H10K 71/00 (2023.02); H10K 2101/30 (2023.02); H10K 2102/351 (2023.02)

(58) Field of Classification Search
None
See application file for complete search history.

(56) References Cited

U.S. PATENT DOCUMENTS 10,680,181 B2 *  6/2020  Takahashi .............. H10K 50/11
2017/0324041 A1 * 11/2017  Yen ...................... H10K 85/657

FOREIGN PATENT DOCUMENTS

DE     112014005483 T5 *  8/2016
KR     20200045292 A   *  5/2020

* cited by examiner

Primary Examiner — Tae H Yoon
(74) Attorney, Agent, or Firm — IPro, PLLC

(57) ABSTRACT

Provided is an organic light emitting device, including a p-type host layer, an n-type host layer, and an interlayer disposed between the p-type host layer and the n-type host layer, wherein at least one of the p-type host layer and the n-type host layer includes a fluorescent dopant, and a preset distance is present between the fluorescent dopant and the interlayer; the p-type host layer and the n-type host layer are configured to form, together with the interlayer, a spatially separated exciplex under an action of driving voltage; and the fluorescent dopant is configured to absorb energy of singlet excitons generated by the exciplex to emit light.

20 Claims, 3 Drawing Sheets

ORGANIC LIGHT EMITTING DEVICE, METHOD OF MANUFACTURING SAME, AND DISPLAY PANEL

CROSS-REFERENCE TO RELATED APPLICATION

This application is based on and claims priority to the Chinese Patent Application No. 202011156775.X, filed on Oct. 26, 2020 and entitled "ORGANIC LIGHT EMITTING DEVICE, METHOD OF MANUFACTURING SAME, AND DISPLAY PANEL", the disclosure of which is herein incorporated by reference in its entirety.

TECHNICAL FIELD

The present disclosure relates to the field of organic electroluminescence display technologies, and more particularly, to an organic light emitting device, a method of manufacturing the same, and a display panel.

BACKGROUND

The thermally-activated Delayed Fluorescent (TADF) technology can be used to manufacture an organic light-emitting diode (OLED), has a rapid development in recent years, and are regarded as a third generation OLED technology. Utilizing the TADF type interface exciplex as a host is a focus of the development of the third generation OLED technology, in which nearly 100% singlet excitons are collected and transferred to the dopants through the delayed fluorescent effect, so as to achieve a theoretical breakthrough of the internal quantum efficiency (IQE) value.

SUMMARY

The embodiments of the present disclosure provide an organic light emitting device, a method of manufacturing the same, and a display panel. The technical solutions are as follows.

In one aspect, an organic light emitting device is provided, including a p-type host layer, an n-type host layer, and an interlayer disposed between the p-type host layer and the n-type host layer, wherein
 at least one of the p-type host layer and the n-type host layer includes a fluorescent dopant, and a preset distance is present between the fluorescent dopant and the interlayer;
 the p-type host layer and the n-type host layer are configured to form, together with the interlayer, a spatially separated exciplex under an action of driving voltage; and
 the fluorescent dopant is configured to absorb energy of singlet excitons generated by the exciplex to emit light.

Optionally, a thickness of the interlayer ranges from 1 nm to 20 nm.

Optionally, a material of the interlayer includes a bipolar material with balanced transport between electrons and holes.

Optionally, the bipolar material includes a carbazole-azine derivative, and the carbazole-azine derivative includes one or more substituents independently selected from a dibenzo-heteroatom five-membered ring or fluorene.

Optionally, a p-type host material of the p-type host layer includes at least one of carbazole, dibenzothiphene, dibenzofuran, aromatic amine, or fluorene.

Optionally, an n-type host material of the n-type host layer includes an azine derivative, and the azine derivative includes one or more substituents independently selected from a dibenzo-heteroatom five-membered ring, fluorene, benzene ring, or biphenyl.

Optionally, a photoluminescence spectrum of a mixed film layer prepared from a p-type host material of the p-type host layer and an n-type host material of the n-type host layer, and an ultraviolet absorption spectrum of the fluorescent dopant, have an overlapping area with a proportion of greater than or equal to 50%.

Optionally, the preset distance ranges from 3 nm to 10 nm.

Optionally, the fluorescent dopant is configured to form at least one of a doped region and a fluorescent layer.

Optionally, a thickness of the fluorescent layer ranges from 0.1 nm to 1.5 nm.

Optionally, energy levels of a p-type host material of the p-type host layer, an n-type host material of the n-type host layer, an interlayer material, and the fluorescent dopant satisfy the following conditions:

$$|HOMO|_{(n-type)} - |LUMO|_{(p-type)} \geq 4 \text{ eV},$$

$$|HOMO|_{(p-type)} - |LUMO|_{(n-type)} \leq 3 \text{ eV},$$

$$|HOMO|_{(p-type\ \&\ n-type)} \leq |HOMO|_{(fluorescent\ dopant)},$$

$$|LUMO|_{(fluorescent\ dopant)} \leq |LUMO|_{(p-type\ \&\ n-type)},$$

$$|HOMO|_{(p-type)} < |HOMO|_{(interlayer)} < |HOMO|_{(n-type)},$$

$$|LUMO|_{(p-type)} < |LUMO|_{(interlayer)} < |LUMO|_{(n-type)},$$

$$S1_{(fluorescent\ dopant)} < S1_{(p-type\ \&\ n-type)}, \text{ and}$$

$$T1_{(fluorescent\ dopant)} < T1_{(p-type\ \&\ n-type)};$$

wherein, $|HOMO|_{(n-type)}$ corresponds to a HOMO energy level of the n-type host material, and $|LUMO|_{(n-type)}$ corresponds to a LUMO energy level of the n-type host material;

$|HOMO|_{(p-type)}$ corresponds to a HOMO energy level of the p-type host material, and $|LUMO|_{(p-type)}$ corresponds to a LUMO energy level of the p-type host material;

$|HOMO|_{(interlayer)}$ corresponds to a HOMO energy level of the interlayer material, and $|LUMO|_{(interlayer)}$ corresponds to a LUMO energy level of the interlayer material;

$|HOMO|_{(fluorescent\ dopant)}$ corresponds to a HOMO energy level of the fluorescent dopant, and $|LUMO|_{(fluorescent\ \&\ dopant)}$ corresponds to a LUMO energy level of the fluorescent dopant;

$|HOMO|_{(p-type\ \&\ n-type)}$ corresponds to a HOMO energy level of an exciplex formed from the n-type host material and the p-type host material;

$|LUMO|_{(p-type\ \&\ n-type)}$ corresponds to a LUMO energy level of an exciplex formed from the n-type host material and the p-type host material;

$S1_{(fluorescent\ dopant)}$ corresponds to energy of a singlet exciton of the fluorescent dopant;

$T1_{(fluorescent\ dopant)}$ corresponds to energy of a triplet exciton of the fluorescent dopant;

$S1_{(p-type\ \&\ n-type)}$ corresponds to energy of a singlet exciton of the exciplex formed from the n-type host material and the p-type host material; and T1$_{(p\text{-}type\ \&\ n\text{-}type)}$ corresponds to energy of a triplet exciton of the exciplex formed from the n-type host material and the p-type host material.

Optionally, the organic light emitting device further includes a hole transport layer (HTL), a hole injection layer (HIL) and an anode that are sequentially disposed on a side of the p-type host layer distal from the interlayer along a direction away from the interlayer, and an electron transport layer (ETL), an electron injection layer (EIL), and a cathode that are sequentially disposed on a side of the n-type host layer distal from the interlayer along a direction away from the interlayer.

In another aspect, a method of manufacturing an organic light emitting device is provided, the method including:
providing a substrate; and
sequentially forming a p-type host layer, an interlayer, and an n-type host layer on the substrate,
wherein at least one of the p-type host layer and the n-type host layer includes a fluorescent dopant, and a preset distance is present between the fluorescent dopant and the interlayer;
the p-type host layer and the n-type host layer are configured to form, together with the interlayer, a spatially separated exciplex under an action of driving voltage; and
the fluorescent dopant is configured to absorb energy of singlet excitons generated by the exciplex to emit light.

Optionally, sequentially forming the p-type host layer, the interlayer, and the n-type host layer on the substrate, includes:
forming a first sub-layer of p-type host material including a fluorescent dopant on the substrate;
forming a second sub-layer of p-type host material on the first sub-layer of p-type host material; and
sequentially forming the interlayer and the n-type host layer on the second sub-layer of p-type host material.

Optionally, a thickness of the second sub-layer of p-type host material matches the preset distance.

Optionally, sequentially forming the p-type host layer, the interlayer, and the n-type host layer on the substrate, includes:
sequentially forming the p-type host layer and the interlayer on the substrate;
forming a second sub-layer of n-type host material on the interlayer; and
forming a first sub-layer of n-type host material including a fluorescent dopant on the second sub-layer of n-type host material.

Optionally, a thickness of the second sub-layer of n-type host material matches the preset distance.

Optionally, a thickness of the interlayer ranges from 1 nm to 20 nm.

Optionally, the substrate includes an anode, a hole injection layer, and a hole transport layer that are stacked; and the method further includes:
sequentially forming an electron transport layer, an electron injection layer and a cathode on the n-type host layer.

In yet another aspect, a display panel is provided, including a substrate, and a plurality of organic light emitting devices disposed on the substrate, wherein each of the plurality of organic light emitting devices includes a p-type host layer, an n-type host layer, and an interlayer disposed between the p-type host layer and the n-type host layer;

at least one of the p-type host layer and the n-type host layer includes a fluorescent dopant, and a preset distance is present between the fluorescent dopant and the interlayer;
the p-type host layer and the n-type host layer are configured to form, together with the interlayer, a spatially separated exciplex under an action of driving voltage; and
the fluorescent dopant is configured to absorb energy of singlet excitons generated by the exciplex to emit light.

DETAILED DESCRIPTION

For clearer descriptions of the objectives, technical solutions, and advantages of the present disclosure, the present disclosure is described in detail hereinafter in combination with specific embodiments and with reference to the accompanying drawings.

It should be noted that unless otherwise defined, technical or scientific terms used in one or more embodiments of the present disclosure shall have ordinary meaning understood by persons of ordinary skill in the art to which the disclosure belongs. The terms "first", "second" and the like used in one or more embodiments of the present disclosure are not intended to indicate any order, quantity or importance, but are merely used to distinguish different components. The terms "comprise, comprises and comprising" or "include, includes and including" and the like are used to indicate that the element or object preceding the terms covers the element or object following the terms and its equivalents, and shall not be understood as excluding other elements or objects. The terms "connect" or "couple" and the like are not intended to be limited to physical or mechanical connections, but may include electrical connections, either direct or indirect connection. The terms "up", "down", "left", "right" and the like are merely used to indicate relationship of relative position, which may also be changed accordingly in the case that the absolute position of the described object is changed.

Figure 1:
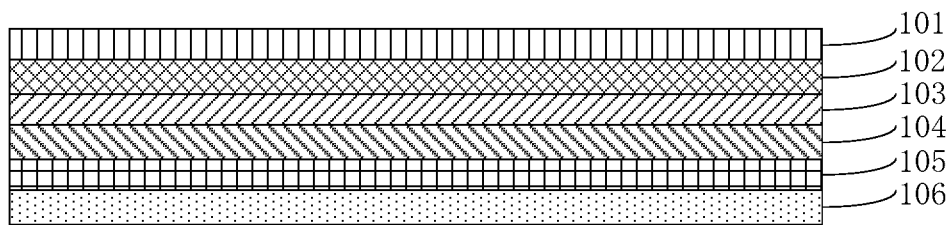
FIG. 1 is a schematic structural diagram of an organic light emitting device according to the related art.

In the related art, referring to FIG. 1, FIG. 1 is a schematic structural diagram of an organic light emitting device according to the related art. An organic light emitting device using a TADF type interface exciplex as a host generally includes an anode 101, a hole transport layer (HTL) 102, a p-type host layer 103, an n-type host layer 104, an electron transport layer (ETL) 105 and a cathode 106 that are stacked. In such an organic light emitting device, the p-type host layer 103 and the n-type host layer 104 are in direct contact, causing excitons generated by the recombination of electrons and holes to concentrate at an interface where the p-type host layer 103 and the n-type host layer 104 meet, thereby resulting in the efficiency roll-off of the organic light emitting device. Furthermore, as the dopant in the organic light emitting device is generally uniformly doped, the exciton generation region and the energy release region (corresponding to the light emitting region) cannot be effectively separated, thereby causing the dopant to directly capture the excitons, leading to a Dexter energy loss, and reducing the overall efficiency of the organic light emitting device.

Figure 2:
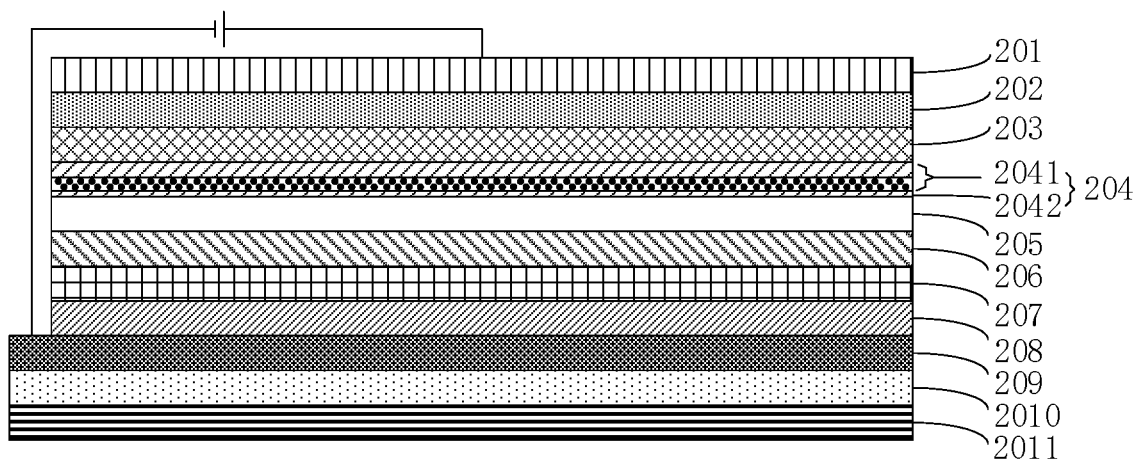
FIG. 2 is a schematic structural diagram of an organic light emitting device according to an embodiment of the present disclosure.
Figure 3:
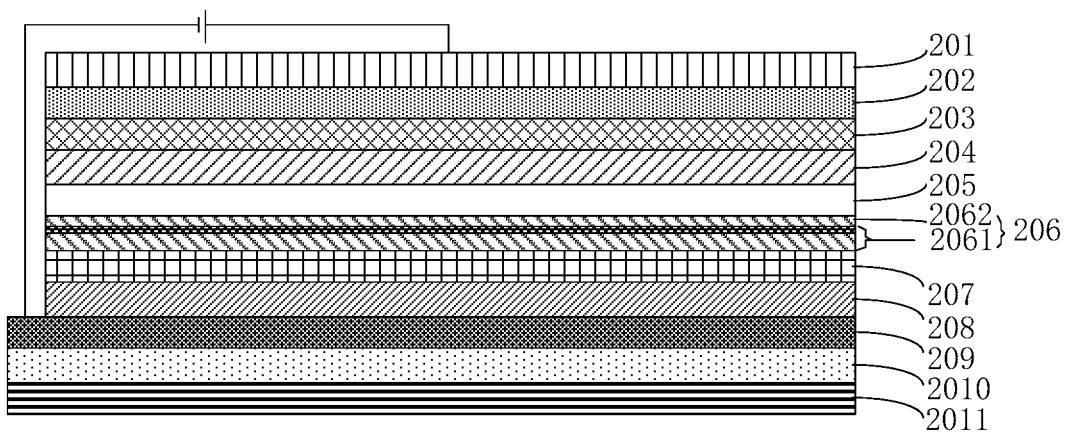
FIG. 3 is a schematic structural diagram of another organic light emitting device according to an embodiment of the present disclosure.

Referring to FIG. 2 and FIG. 3, FIG. 2 is a schematic structural diagram of an organic light emitting device according to an embodiment of the present disclosure, and FIG. 3 is a schematic structural diagram of another organic light emitting device according to an embodiment of the present disclosure. The organic light emitting device may include a p-type host layer 204 and an n-type host layer 206, and an interlayer 205 disposed between the p-type host layer 204 and the n-type host layer 206.

At least one of the p-type host layer 204 and the n-type host layer 206 comprises a fluorescent dopant (FD) and a preset distance is present between the fluorescent dopant and the interlayer 205.

Here, the p-type host layer 204 and the n-type host layer 206 are configured to form, together with the interlayer 205, a spatially separated exciplex under the action of a driving voltage. The fluorescent dopant is configured to absorb the energy of singlet excitons generated by the exciplex to emit light.

It should be noted that the p-type host layer 204 is made of a p-type host material, and the p-type host material acts as a donor of the exciplex and is capable of transporting holes. The n-type host layer 206 is made of a n-type host material, and the n-type host material acts as an acceptor of the exciplex and is capable of transporting electrons.

In the embodiments of the present disclosure, by disposing the interlayer 205 between the p-type host layer 204 and the n-type host layer 206, the p-type host layer 204 and the interlayer 205 may form a spatially separated exciplex, and the n-type host layer 206 and the interlayer 205 may form a spatially separated exciplex, under the action of a driving voltage, thereby enlarging the distribution region of the excitons generated by the exciplex, and effectively reducing the exciton quenching and the efficiency roll-off due to the unduly concentrated excitons. In addition, the spatial distance can reduce the difference in energy level between the triplet excitons and the singlet excitons generated by the exciplex, thereby promoting the reverse intersystem crossing (RISC) of the triplet excitons to the singlet excitons, and improving the exciton utilization. Further, by setting the distance between the fluorescent dopant in the p-type host layer 204 and/or the n-type host layer 206 and the interlayer 205, the exciton generation region and the energy release region (i.e., the light emitting region) can be effectively separated, thereby avoiding an energy loss resulting from the fluorescent dopant directly capturing the excitons. Thus, by disposing the interlayer 205 and setting the position of the fluorescent dopant, the efficiency roll-off of the organic light emitting device can be reduced, and the efficiency of the organic light emitting device can be improved.

Figure 4:
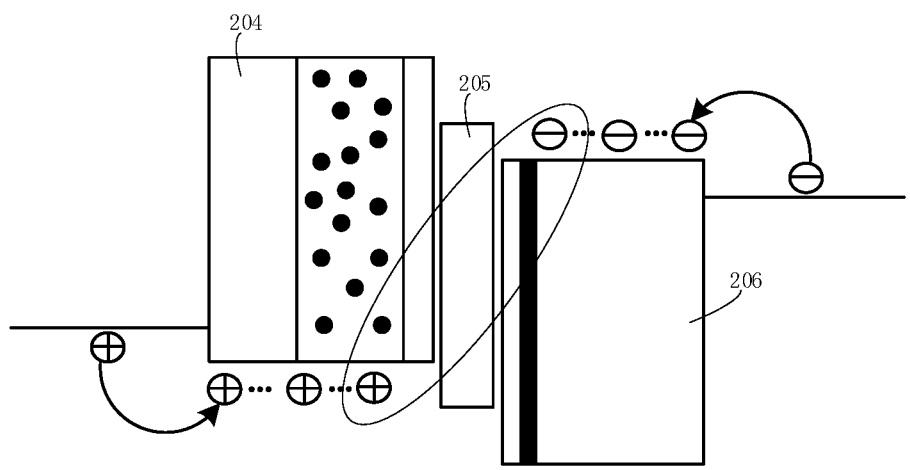
FIG. 4 is a schematic diagram showing an electroluminescent mechanism of an organic light emitting device according to an embodiment of the present disclosure.

Referring to FIG. 4, FIG. 4 is a schematic diagram showing an electroluminescent mechanism of an organic light emitting device according to an embodiment of the present disclosure. Under the action of a driving voltage, the p-type host layer 204 and the interlayer 205 may form a spatially separated exciplex, and the n-type host layer 206 and the interlayer 205 may form a spatially separated exciplex. Generally, the difference in energy level between the singlet excitons and the triplet excitons generated by the exciplex is small, so that the triplet excitons can be up-converted to the singlet excitons through the reverse intersystem crossing (RISC). Moreover, the presence of the spatial distance between the donor and the acceptor of the spatially separated exciplex in the embodiments of the present disclosure further reduces the difference in energy level between the singlet excitons and the triplet excitons, which may help to up-convert the triplet excitons to the singlet excitons, thereby achieving the effect of almost 100% collection of the energy of excitons in the form of singlet excitons. Further, the fluorescent dopant in the p-type host layer 204 and/or the n-type host layer 206 can absorb the energy of the aforementioned singlet excitons to realize the luminescence.

It should be noted that, although the difference in energy level between the singlet excitons and the triplet excitons generated by the exciplex decreases as the distance between the donor and acceptor increases, when the thickness of the interlayer 204 exceeds the long-range coupling distance of hole-electron pair in the exciplex, it would be difficult to form an effective exciplex and thus it would be not available to convert the electrical energy as applied to stable luminous energy.

As a result, in some embodiments, the thickness of the interlayer may range from 1 nm to 20 nm. By setting the thickness of the interlayer, the spatial distance between the acceptor and the donor in the exciplex can be broadened as much as possible while ensuring a spatially separated exciplex being formed effectively, thereby effectively reducing the difference in energy level between the singlet excitons and the triplet excitons generated by the exciplex, increasing the proportion of the triplet excitons up-converting to the singlet excitons, and further improving the energy utilization efficiency of the organic light emitting device.

Optionally, the thickness of the interlayer may be 1.0 nm, 1.5 nm, 1.6 nm, 2.1 nm, 2.5 nm, 3 nm, 4 nm, 5 nm, 5.2 nm, 5.3 nm, 6 nm, 7 nm, 8.4 nm, 9.1 nm, 10 nm, 12 nm, 14 nm, 17 nm, 18.7 nm, or 20 nm. As an optional embodiment, the thickness of the interlayer ranges from 3 nm to 10 nm. It should be noted that the thickness of the interlayer may be determined based on the long-range coupling distance of the hole-electron pair in the exciplex, which is not specifically limited here.

In some embodiments of the present disclosure, the interlayer may include a bipolar material with balanced transport between electrons and holes. It should be noted that the energy level requirement to be satisfied by the material of the interlayer may be selected based on the specific location of the fluorescent dopant in the p-type host layer and/or the n-type host layer. When the location of the fluorescent dopant is different, the energy level requirement to be satisfied by the material making up the interlayer is also different, and the following two circumstances are used for schematically illustrating the embodiments of the present disclosure.

In a first circumstance, in the case that the fluorescent dopant is located within the p-type host layer, the energy level of the material of the interlayer 205 satisfies the following conditions: $|LUMO|_{(interlayer)}-|LUMO|_{(p-type)} \geq 0.4$ eV, $|HOMO|_{(interlayer)}-|HOMO|_{(p-type)} \geq 0.2$ eV; $|LUMO|_{(n-type)}-|LUMO|_{(interlayer)} \geq 0.2$ eV, $|HOMO|_{(n-type)}-|HOMO|_{(interlayer)} \geq 0.4$ eV.

In a second circumstance, in the case that the fluorescent dopant is located within the n-type host layer, the energy level of the material of the interlayer 205 satisfies the following conditions: $|LUMO|_{(interlayer)}-|LUMO|_{(p-type)} \geq 0.2$ eV, $|HOMO|_{(interlayer)}-|HOMO|_{(p-type)} \geq 0.4$ eV; $|LUMO|_{(n-type)}-|LUMO|_{(interlayer)} \geq 0.4$ eV, $|HOMO|_{(n-type)}-|HOMO|_{(interlayer)} \geq 0.2$ eV.

It should be understood that HOMO refers to the highest occupied energy level; and LUMO refers to the lowest unoccupied energy level. For example, $|HOMO|_{(n-type)}$ corresponds to a HOMO energy level of the n-type host material, and $|LUMO|_{(n-type)}$ corresponds to a LUMO energy level of the n-type host material; $|HOMO|_{(p-type)}$ corresponds to a HOMO energy level of the p-type host material, and $|LUMO|_{(p-type)}$ corresponds to a LUMO energy level of the p-type host material; $|HOMO|_{(interlayer)}$ corresponds to a HOMO energy level of the interlayer material, and $|LUMO|_{(interlayer)}$ corresponds to a LUMO energy level of the interlayer material.

With such arrangement, the interlayer can prevent charge carriers from drifting to the opposite layer by utilizing the difference in energy level, so that the effect of blocking the excitons can be achieved.

As an example, the bipolar material making up the interlayer may include a carbazole-azine derivative, and the carbazole-azine derivative may include one or more substituents independently selected from a dibenzo-heteroatom five-membered ring or fluorene.

Optionally, the p-type host material of the p-type host layer includes one or more of carbazole, dibenzothiphene, dibenzofuran, aromatic amine, or fluorene. The n-type host material of the n-type host layer includes an azine derivative, and the azine derivative includes one or more substituents independently selected from a dibenzo-heteroatom five-membered ring, fluorene, benzene ring, or biphenyl.

Here, by selecting the interlayer material, the p-type host material (i.e., the donor material of the exciplex), and the n-type host material (i.e., the acceptor material of the exciplex), it is beneficial to achieve an equilibrium distribution of the holes and the electrons, and avoid the phenomenon of imbalanced charge carrier distribution, thereby avoiding the charge carrier quenching induced by the imbalanced charge carrier distribution and facilitating the improvement of the luminous efficiency of the organic light emitting device.

In the embodiments of the present disclosure, the photoluminescence (PL) spectrum of a mixed film layer prepared from the p-type host material of the p-type host layer and the n-type host material of the n-type host layer, and the ultraviolet absorption spectrum of the fluorescent dopant, have an overlapping area greater than or equal to 50%. As such, it can be guaranteed that the excitons formed by the exciplex can be efficiently transferred to the fluorescent dopant, thereby avoiding the waste of the excitons, and further improving the efficiency of the organic light emitting device.

It should be noted that, when the proportion of the overlapping area is higher, it would be more beneficial to guarantee the performance of the organic light emitting device. Exemplarily, the overlapping area may be 50%, 60%, 76%, 80%, 83%, 90%, 95%, etc. Here, there is no need to limit the detailed material of the fluorescent dopant, as long as the material satisfies the requirements of the embodiments of the present disclosure.

For example, the fluorescent dopant may include pyrene, methylquinacridine (MQA), N,N'-dimethylquinacridone (DMQA), rubrene or 4-dicyanmethylene-2-methyl-6-(p-dimethylaminostyrene) H-pyran (DCM). It should be noted that those skilled in the art can make a reasonable choice on the materials of the fluorescent dopant based on the color requirements of the organic light emitting device, which is not specifically limited here.

In some embodiments of the present disclosure, the preset distance between the fluorescent dopant in the p-type host layer and/or the n-type host layer and the interlayer ranges from 3 nm to 10 nm. By setting a preset distance, the energy of the singlet excitons can be transferred to the fluorescent dopant to emit light according to the Förster energy transfer mechanism, rather than according to the Dexter energy transfer mechanism, thereby effectively reducing the energy loss of the Dexter energy transfer mechanism and triplet-triplet annihilation (TTA).

Optionally, the preset distance may range from 4 nm to 9.5 nm, 4.5 nm to 9 nm, 5 nm to 9 nm, 5 nm to 10 nm, 5.5 nm to 8 nm, 6 nm to 7 nm, or the like. For example, the preset distance may be 3 nm, 4 nm, 5 nm, 5.2 nm, 5.3 nm, 6 nm, 7 nm, 8.4 nm, 9.1 nm, or 10 nm. It should be noted that the preset distance may be reasonably determined according to the intermolecular dipole-effect distance between the fluorescent dopant and the exciplex, which is not specifically limited here.

In the embodiments of the present disclosure, the fluorescent dopant in the p-type host layer and/or the n-type host layer can form at least one of a doped region or a fluorescent layer. Thus, the embodiments of the present disclosure will be schematically illustrated by the following two possible implementations.

In a first possible implementation, as shown in FIG. 2, the fluorescent dopant is located within the p-type host layer 204, and the fluorescent dopant forms a doped region. In this case, the p-type host layer 204 may include a first sub-layer of p-type host material 2041 and a second sub-layer of p-type host material 2042, and the second sub-layer of p-type host material 2042 is more proximate to the interlayer 205 relative to the first sub-layer of p-type host material 2041. The first sub-layer of p-type host material 2041 includes the fluorescent dopant. Here, the thickness of the second sub-layer of p-type host material 2042 matches the preset distance to ensure that the distance between the fluorescent dopant in the first sub-layer of p-type host material 2041 and the interlayer 205 is a preset distance.

In the embodiments of the present disclosure, the doped region is formed by doping fluorescent dopant of a certain concentration in a specific region of the p-type host layer (or the n-type host layer). Optionally, the thickness of the doped region may range from 3 nm to 30 nm. For example, the thickness of the doped region may be 3 nm, 5 nm, 5.3 nm, 10 nm, 20 nm, or 30 nm. The doping concentration of the fluorescent dopant may range from 5% to 20%. For example, the doping concentration may be 5%, 7%, 10%, 13%, 17%, or 20%.

In a second possible implementation, as shown in FIG. 3, the fluorescent dopant is located within the n-type host layer 206, and the fluorescent dopant forms a fluorescent layer. In this case, the n-type host layer 206 may include a first sub-layer of n-type host material 2061 and a second sub-layer of n-type host material 2062, and the first sub-layer of n-type host material 2061 is more proximate to the interlayer 205 relative to the second sub-layer of n-type host material 2062. The first sub-layer of n-type host material 2061 includes the fluorescent dopant. Here, the thickness of the second sub-layer of n-type host material 2062 matches the preset distance to ensure that the distance between the fluorescent dopant in the first sub-layer of n-type host material 2061 and the interlayer 205 is a preset distance.

In the embodiments of the present disclosure, the fluorescent layer refers to a specific or individual fluorescent layer formed by doping the fluorescent dopant in the n-type host layer (or the p-type host layer). Optionally, the thickness of the fluorescent layer may range from 0.1 nm to 1.5 nm. For example, the thickness of the fluorescent layer may be 0.1 nm, 0.2 nm, 0.3 nm, 0.6 nm, 0.8 nm, 1.1 nm, 1.4 nm, or 1.5 nm.

It should be noted that the embodiments of the present disclosure provide different doping means, and those skilled in the art can make a selection based on the requirements of the device, the control precision, and the like.

In some embodiments of the present disclosure, energy levels of the p-type host material of the p-type host layer, the n-type host material of the n-type host layer, the interlayer material, and the fluorescent dopant satisfy the following conditions.

$$|HOMO|_{(n-type)} - |LUMO|_{(p-type)} \geq 4 \text{ eV},$$

$$|HOMO|_{(p-type)} - |LUMO|_{(n-type)} \leq 3 \text{ eV},$$

$$|HOMO|_{(p-type \ \& \ n-type)} \leq |HOMO|_{(fluorescent \ dopant)},$$

$$|LUMO|_{(fluorescent \ dopant)} \leq |LUMO|_{(p-type \ \& \ n-type)},$$

$$|HOMO|_{(p-type)} < |HOMO|_{(interlayer)} < |HOMO|_{(n-type)},$$

$$|LUMO|_{(p-type)} < |LUMO|_{(interlayer)} < |LUMO|_{(n-type)},$$

$$S1_{(fluorescent \ dopant)} < S1_{(p-type \ \& \ n-type)}, \text{ and}$$

$$T1_{(fluorescent \ dopant)} < T1_{(p-type \ \& \ n-type)};$$

wherein, $|HOMO|_{(n-type)}$ corresponds to a HOMO energy level of the n-type host material, and $|LUMO|_{(n-type)}$ corresponds to a LUMO energy level of the n-type host material;

$|HOMO|_{(p-type)}$ corresponds to a HOMO energy level of the p-type host material, and $|LUMO|_{(p-type)}$ corresponds to a LUMO energy level of the p-type host material;

$|HOMO|_{(interlayer)}$ corresponds to a HOMO energy level of the interlayer material, and $|LUMO|_{(interlayer)}$ corresponds to a LUMO energy level of the interlayer material;

$|HOMO|_{(fluorescent \ dopant)}$ corresponds to a HOMO energy level of the fluorescent dopant, and $|LUMO|_{(fluorescent \ \& \ dopant)}$ corresponds to a LUMO energy level of the fluorescent dopant;

$|HOMO|_{(p-type \ \& \ n-type)}$ corresponds to a HOMO energy level of an exciplex formed by the n-type host material and the p-type host material;

$|LUMO|_{(p-type \ \& \ n-type)}$ corresponds to a LUMO energy level of an exciplex formed by the n-type host material and the p-type host material;

$S1_{(fluorescent \ dopant)}$ corresponds to the energy of a singlet exciton of the fluorescent dopant;

$T1_{(fluorescent \ dopant)}$ corresponds to the energy of a triplet exciton of the fluorescent dopant;

$S1_{(p-type \ \& \ n-type)}$ corresponds to the energy of a singlet exciton of the exciplex formed by the n-type host material and the p-type host material; and $T1_{(p-type \ \& \ n-type)}$ corresponds to the energy of a triplet exciton of the exciplex formed by the n-type host material and the p-type host material.

By defining the energy levels of the interlayer material, the n-type host material, and the p-type host material, it helps to form the exciplex, and the distribution region of the exciton can be enlarged. By defining the energy levels of the fluorescent dopant and the exciplex, and the energy relationship of the singlet excitons and the triplet excitons, it can be ensured that the singlet excitons generated by the exciplex can be transferred to the fluorescent dopant, realizing effective transfer of energy.

In the embodiments of the present disclosure, referring to FIG. 2 and FIG. 3, the organic light emitting device may further include a hole transport layer 203, a hole injection layer 202, and an anode 201 disposed sequentially on a side of the p-type host layer 204 distal from the interlayer 205, and an electron transport layer 207, an electron injection layer 208, and a cathode 209 sequentially disposed on a side of the n-type host layer 206 distal from the interlayer 205.

It should be understood that the anode 201 and the cathode 209 are configured to apply a driving voltage to provide an electrical drive to the organic light emitting device. The hole injection layer 202 is configured to reduce the hole injection barrier and improve the hole injection efficiency.

Optionally, the material of the anode 201 includes indium tin oxide (ITO) or indium zinc oxide (IZO) which has a high work function, and the thickness of the anode 201 ranges from 80 nm to 200 nm. Optionally, the reference value of the average reflectance of the anode 201 in the visible light region ranges from 85% to 95%.

Optionally, a thickness of the hole injection layer 202 ranges from 5 nm to 20 nm. For example, the thickness of the hole injection layer is 5 nm, 6 nm, 9.5 nm, 12.3 nm, 15.8 nm, or 20 nm. The material of the hole injection layer 202 includes one or more of HATCN, CuPc, NPB: $F_4$TCNQ or TAPC: $MnO_3$.

Optionally, the material of the hole transport layer 203 includes a material having a relatively high hole mobility, which is not specifically limited here. The thickness of the hole transport layer 203 may range from 100 nm to 140 nm. For example, the thickness of the hole transport layer 203 is 100 nm, 120 nm, 125 nm, 135 nm, or 140 nm.

Optionally, the material of the electron transport layer 207 includes one or more of TmPyPB, TmPyTZ, B3PYMPM, TBBi, Bphen, or PO-T2T. Optionally, the thickness of the electron transport layer 207 may range from 20 nm to 100 nm. For example, the thickness of the electron transport layer 207 is 20 nm, 24 nm, 33 nm, 40 nm, 48 nm, 51 nm, 57 nm, 60 nm, 85 nm, or 100 nm.

Optionally, the material of the electron injection layer 208 includes one or more of $CsCO_3$, PEI+ZnO, ZnO+$K_2CO_3$, or ZnO+PEIE: Liq. Optionally, the thickness of the electron injection layer 208 ranges from 0.5 nm to 5 nm. For example, the thickness of the electron injection layer 208 is 0.5 nm, 1 nm, 1.8 nm, 2.2 nm, 3 nm, 4.1 nm, or 5 nm.

Here, the electron transport layer 207 and the electron injection layer 208 may be prepared by vacuum evaporation, which is not specifically limited here.

Optionally, the cathode may be prepared by evaporating to form a film of Mg, Ag, or Al, or may be prepared by an alloy such as Mg: Ag. For example, the ratio of Mg:Ag may range from 3:7 to 1:9.

It should be noted that, the cathodes 209*a* of a top-emission organic light emitting device and a bottom-emission organic light emitting device are different.

For example, when the organic light emitting device is of a top-emission structure, the thickness of the cathode may range from 10 nm to 20 nm. The reference value of the transmittance of the metal film layer of the cathode at a wavelength of 530 nm may range from 50% to 60%. For example, when the organic light emitting device is of a bottom-emission structure, the thickness of the cathode is no less than 80 nm to ensure a good reflectivity.

In some embodiments, the organic light emitting device further includes a capping layer 2010 and an encapsulation layer 2011. The capping layer 2010 (CPL) and the encapsulation layer 2011 are disposed on a side of the cathode 209 distal from the electron injection layer 208.

Optionally, the capping layer 2010 is prepared by evaporating a small molecule organic material with a thickness ranging from 50 nm to 80 nm. Optionally, the refractive index of the material of the capping layer at a wavelength of 460 nm should be greater than 1.8.

Optionally, the encapsulation layer 2011 may be encapsulated with a sealant or a thin film, which is not specifically limited here.

In summary, in the organic light emitting devices provided by the embodiments of the present disclosure, by disposing the interlayer between the p-type host layer and the n-type host layer, the p-type host layer and the interlayer may form a spatially separated exciplex, and the n-type host layer and the interlayer may form a spatially separated exciplex, under the action of a driving voltage, thereby enlarging the distribution region of the excitons generated by the exciplex, and effectively reducing the exciton quenching and the efficiency roll-off due to the unduly concentrated excitons. In addition, the spatial distance can reduce the difference in energy level between the triplet excitons and the singlet excitons generated by the exciplex, thereby promoting the reverse intersystem crossing (RISC) of the triplet excitons to the singlet excitons, and improving the exciton utilization. Further, by setting the distance between the fluorescent dopant in the p-type host layer and/or the n-type host layer and the interlayer, the exciton generation region and the energy release region (i.e., the light emitting region) can be effectively separated, thereby avoiding an energy loss resulting from the fluorescent dopant directly capturing the excitons. Thus, by disposing the interlayer and setting the position of the fluorescent dopant, the efficiency roll-off of the organic light emitting device can be reduced, and the efficiency of the organic light emitting device can be improved.

Figure 5:
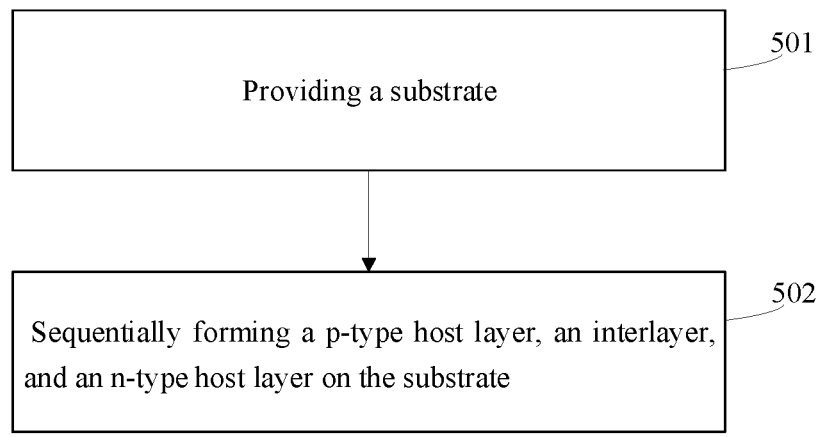
FIG. 5 is a flowchart showing a method of manufacturing an organic light emitting device according to an embodiment of the present disclosure.

The embodiments of the present disclosure further provide a method of manufacturing an organic light emitting device. FIG. 5 is a flowchart showing a method of manufacturing an organic light emitting device according to an embodiment of the present disclosure. The method of manufacturing the organic light emitting device includes the following steps.

In step 501, a substrate is provided.

Optionally, the substrate may include an anode, a hole injection layer, and a hole transport layer that are stacked. It should be noted that the anode, the hole injection layer, and the hole transport layer may be disposed sequentially on a back plane (BP) substrate.

For example, the BP substrate may be sequentially placed in acetone, ethanol, and deionized water for ultrasonic clean, and then placed in an oven for drying. Thereafter, an anode material may be sputtered onto the BP substrate in a vacuum chamber to obtain the anode. Then, the hole injection layer and the hole transport layer may be sequentially obtained by vacuum evaporation.

In step 502, a p-type host layer, an interlayer, and an n-type host layer are sequentially formed on the substrate.

Here, at least one of the p-type host layer and the n-type host layer includes a fluorescent dopant, and a preset distance is present between the fluorescent dopant and the interlayer.

Here, the p-type host layer and the n-type host layer are configured to form, together with the interlayer, a spatially separated exciplex under the action of a driving voltage. The fluorescent dopant is configured to absorb the energy of singlet excitons generated by the exciplex to emit light.

In some embodiments of the present disclosure, the p-type host layer may be disposed on a side of the substrate distal from the anode.

It should be noted that the materials of the p-type host layer, the interlayer, and the n-type host layer are described above, which is not repeated here.

It should also be noted that the thicknesses of the interlayer are described above, which is not repeated here. Optionally, the interlayer may be prepared by vacuum evaporation.

In some embodiments, the thickness of the p-type host layer may range from 3 nm to 60 nm. For example, the thickness of the p-type host layer may be 3 nm, 5 nm, 13 nm, 25 nm, 30 nm, 32.5 nm, 46 nm, 50 nm, 55 nm, or 60 nm. Optionally, the p-type host layer is prepared by vacuum evaporation.

In some embodiments, the thickness of the n-type host layer may range from 3 nm to 60 nm. For example, the thickness of the p-type host layer may be 3 nm, 5 nm, 14 nm, 28 nm, 30 nm, 32.5 nm, 46 nm, 51 nm, 55 nm, or 60 nm. Optionally, the n-type host layer is prepared by vacuum evaporation.

In the embodiments of the present disclosure, after the above step 502, the method of manufacturing the organic light emitting device may further include sequentially forming an electron transport layer, an electron injection layer, and a cathode on the n-type host layer. For example, the electron transport layer, the electron injection layer, and the cathode may be sequentially obtained by vacuum evaporation.

The organic light emitting devices in the above embodiments can be obtained by such a preparation method which has a great process operability and is easy to implement.

Figure 6:
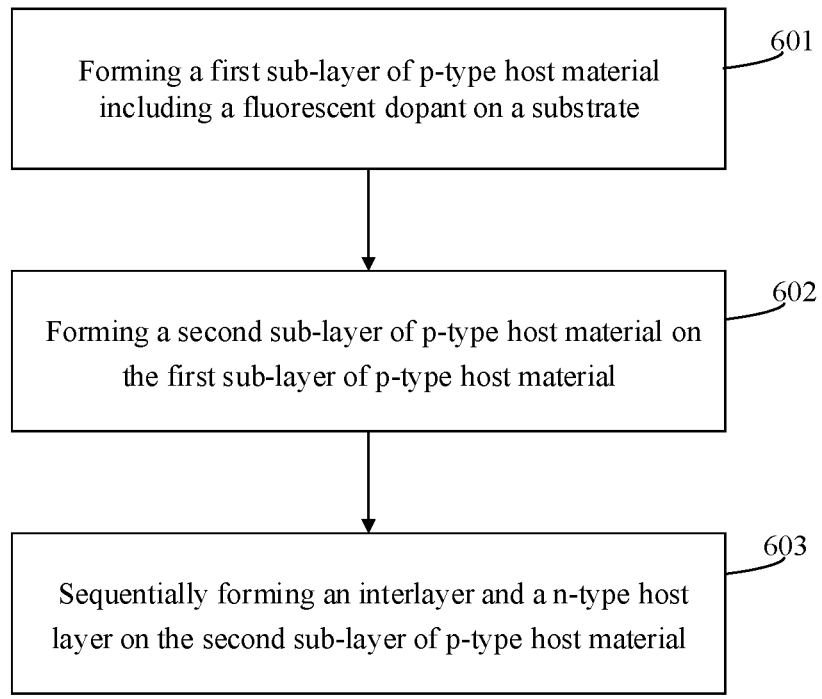
FIG. 6 is a flowchart showing a method of manufacturing another organic light emitting device according to an embodiment of the present disclosure.

In a possible implementation, as shown in FIG. 2 and FIG. 6, FIG. 6 is a flowchart showing a method of manufacturing another organic light emitting device according to an embodiment of the present disclosure. The step of sequentially forming the p-type host layer, the interlayer, and the n-type host layer on the substrate in the above step 502, may include the following steps.

In step 601, a first sub-layer of p-type host material including a fluorescent dopant is formed on a substrate.

It should be noted that the fluorescent dopant may be located within the first sub-layer of p-type host material 2041 such that the fluorescent dopant can be close to the interlayer 205.

In step 602, a second sub-layer of p-type host material is formed on the first sub-layer of p-type host material.

Optionally, the thickness of the second sub-layer of p-type host material 2042 needs to match the preset distance.

In step 603, the interlayer and the n-type host layer are sequentially formed on the second sub-layer of p-type host material.

By preparing the organic light emitting device with such method, a distance between the fluorescent dopant and the interlayer can be controlled accurately, and the precision of the process is high.

Figure 7:
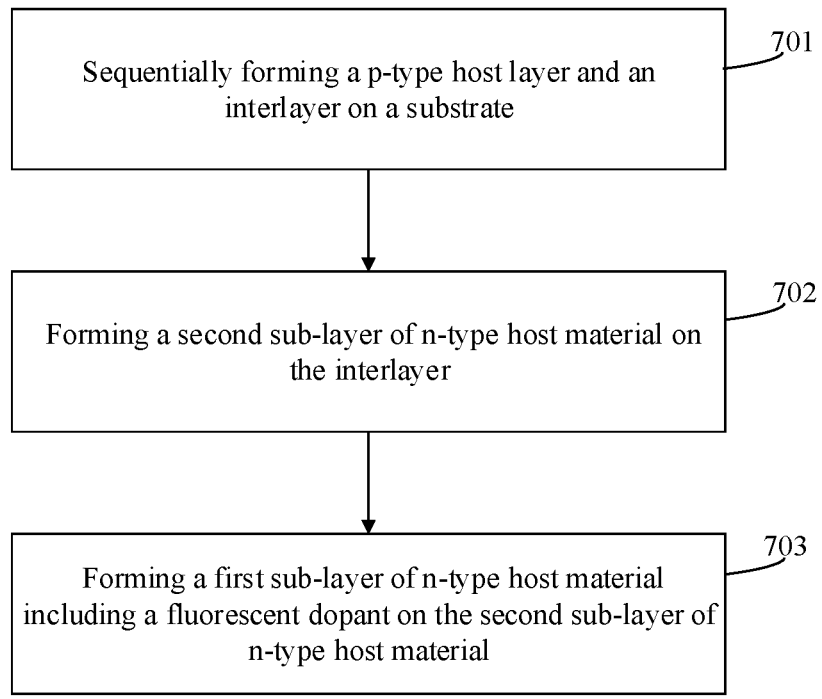
FIG. 7 is a flowchart showing a method of manufacturing still another organic light emitting device according to an embodiment of the present disclosure.

In another possible implementation, as shown in FIG. 3 and FIG. 7, FIG. 7 is a flowchart showing a method of manufacturing still another organic light emitting device according to an embodiment of the present disclosure. The step of sequentially forming the p-type host layer, the interlayer, and the n-type host layer on the substrate in the above step 502, may include the following steps.

In step 701, a p-type host layer and an interlayer are sequentially formed on a substrate.

In step 702: a second sub-layer of n-type host material is formed on the interlayer.

Optionally, the thickness of the second sub-layer of n-type host material 2062 matches the preset distance.

In step 703: a first sub-layer of n-type host material including a fluorescent dopant is formed on the second sub-layer of n-type host material.

It should be noted that the fluorescent dopant may be located within the first sub-layer of n-type host material 2061 such that the fluorescent dopant can be close to the interlayer 205.

By preparing the organic light emitting device with such method, a distance between the fluorescent dopant and the interlayer can be controlled accurately, and the precision of the process is high.

As an optional implementation, the fluorescent dopant in the first sub-layer of p-type host material or the first sub-layer of n-type host material is configured to form a doped region or a fluorescent layer.

Optionally, the doped region is prepared by vacuum evaporation with both the fluorescent dopant and the p-type host material (or the n-type host material).

Optionally, the fluorescent layer is prepared by low-rate vacuum evaporation. Further, the fluorescent layer may have a microscopic morphology of discontinuous islands when observed with a scanning electron microscope (SEM). Optionally, the thickness of the fluorescent layer may range from 0.1 to 1.5 nm.

The embodiments of the present disclosure further provide a display panel. The display panel may include a substrate, and a plurality of organic light emitting devices disposed on the substrate. The organic light emitting device may be any of the aforementioned organic light emitting devices, for example, the organic light emitting device may be the organic light emitting device shown in FIG. 2 or FIG. 3. It can be understood by those skilled in the art that, as the display panel may include any one of the aforementioned organic light emitting device, and thus would have the advantage of the aforementioned organic light emitting device, which is not repeated here.

To further verify the performance of the organic light emitting device provided by the embodiments of the present disclosure, the following specific embodiments are provided for facilitate the understanding.

Example 1, A Top-Emission Doped Organic Light Emitting Device

The specific structure thereof is as follows: ITO/HIL (10 nm)/HTL (90 nm)/p-type host material (15 nm)+p-type host material (20 nm): FD (10%)+p-type host material (5 nm)/interlayer (x nm)/n-type host material (40 nm)/ETL (50 nm)/EIL (3 nm)/Mg:Ag. Here, x represents the thickness of the interlayer, and x=1 nm, 4 nm, or 8 nm.

Example 2, A Top-Emission Doped Organic Light Emitting Device

The specific structure thereof is as follows: ITO/HIL (10 nm)/HTL (90 nm)/p-type host material (40 nm)/interlayer (x nm)/n-type host material (5 nm)+n-type host material (20 nm): FD (10%)+n-type host material (15 nm)/ETL (50 nm)/EIL (3 nm)/Mg:Ag. Here, x represents the thickness of the interlayer, and x=1 nm, 4 nm, or 8 nm.

Example 3, A Top-Emission Non-Doped Organic Light Emitting Device

The specific structure thereof is as follows: ITO/HIL (10 nm)/HTL (90 nm)/p-type host material (40 nm)/interlayer (4 nm)/n-type host material (5 nm)+fluorescent layer (y nm)+n-type host material (35 nm)/ETL (50 nm)/EIL (3 nm)/Mg:Ag. Here, y represents the thickness of the fluorescent layer, and y=0.2 nm, 0.5 nm, or 1.0 nm.

Comparative Example 1: a Top-Emission Doped Organic Light Emitting Device without an Interlayer The specific structure thereof is as follows: ITO/HIL (10 nm)/HTL (90 nm)/p-type host material (15 nm)+p-type host material (20 nm): FD (10%)+p-type host material (5 nm)/n-type host material (40 nm)/ETL (50 nm)/EIL (3 nm)/Mg:Ag.

Comparative Example 2: a Top-Emission Uniformly-Doped Organic Light Emitting Device with an Interlayer The specific structure thereof is as follows: ITO/HIL (10 nm)/HTL (90 nm)/p-type host material: FD (40 nm, 10%)/interlayer (1 nm)/n-type host material: FD (40 nm, 10%)/ETL (50 nm)/EIL (3 nm)/Mg:Ag.

Comparative Example 3: a Top-Emission Undoped Organic Light Emitting Device without an Interlayer The specific structure thereof is as follows: ITO/HIL (10 nm)/HTL (90 nm)/p-type host material (40 nm)/n-type host material (5 nm)+fluorescent layer (0.5 nm)+n-type host material (35 nm)/ETL (50 nm)/EIL (3 nm)/Mg:Ag.

The anodes and cathodes of the organic light emitting devices prepared by the above Examples and the comparative Examples are respectively applied with a voltage to make the organic light emitting devices emit light, and the CIE color value and efficiency of each light emitting device are measured.

The actual data of the organic light emitting device (D2) with an interlayer of 4 nm in Example 1 is used as a 100% standard to calculate the efficiency and the efficiency roll-off of other organic light emitting device in Example 1, the organic light emitting devices in Example 2, the organic light emitting device in Comparative Example 1, and the organic light emitting device in Comparative Example 2 relative to D2, and the results are shown in Table 1.

TABLE 1

|  | Device | Interlayer (nm) | CIE | Driving voltage | efficiency | efficiency roll-off |
|---|---|---|---|---|---|---|
| Example 1 | D1 | x = 1 | (0.665, 0.333) | 96% | 90% | 123% |
|  | D2 | x = 4 | (0.661, 0.334) | 100% | 100% | 100% |
|  | D3 | x = 8 | (0.656, 0.337) | 120% | 77% | 129% |
| Example 2 | D4 | x = 1 | (0.660, 0.329) | 94% | 89% | 113% |
|  | D5 | x = 4 | (0.657, 0.331) | 106% | 98% | 101% |
|  | D6 | x = 8 | (0.650, 0.338) | 114% | 75% | 121% |
| Comparative Example 1 | D-r1 | — | (0.667, 0.329) | 92% | 68% | 179% |
| Comparative Example 2 | D-r2 | x = 1 | (0.664, 0.332) | 103% | 101% | 147% |

It can be seen from the experimental data in Table 1 that, in the top-emission doped organic light emitting devices, Example 1 and Example 2 each having an interlayer exhibit superior efficiency and less efficiency roll-off compared to Comparative Example 1 without an interlayer, and the voltage is increased to an acceptable degree, which proves that the interlayer can enlarge the distribution region of the excitons and act to block the excitons. Comparing the three organic light emitting devices in Example 1 and the three organic light emitting devices in Example 2 respectively, it can be seen that, when the thickness of the interlayer is 4 nm, the organic light emitting device exhibits a best performance, indicating that this thickness is within an optical range which can balance the long range coupling effect of the hole-electron and the difference in energy level among the excitons to a better degree. Further, comparing Example 1, Example 2, and Comparative Example 2, it can be seen that Comparative Example 2 which has a uniform doping has a greater efficiency roll-off relative to Example 1 and Example 2 which have a non-uniform doping. It follows that by setting the preset distance between the fluorescent dopant and the interlayer, the exciton generation region and the energy release region can be effectively separated, thereby preventing the fluorescent dopant from directly capturing the charge carriers to avoid the non-radiative triplet excitons, and in turn reducing the efficiency roll-off of the organic light emitting device.

The actual data of the organic light emitting device (D8) with the fluorescent layer of 0.5 nm in Example 3 is used as a 100% standard to calculate the efficiency and the efficiency roll-off of other organic light emitting devices in Example 3, and the organic light emitting device in Comparative Example 3 with respect to D8, and the results are shown in Table 2.

TABLE 2

|  | Device | fluorescent layer (nm) | CIE | Driving voltage | efficiency | efficiency roll-off |
|---|---|---|---|---|---|---|
| Example 3 | D7 | y = 0.2 | (0.660, 0.331) | 95% | 82% | 109% |
|  | D8 | y = 0.5 | (0.655, 0.326) | 100% | 100% | 100% |
|  | D9 | y = 1 | (0.656, 0.328) | 101% | 74% | 114% |
| Comparative Example 3 | D-r3 | y = 0.5 | (0.656, 0.327) | 90% | 61% | 163% |

As can be seen from the experimental data of Table 2, in the top-emission non-doped organic light emitting device, Example 3 having an interlayer exhibits superior efficiency and less efficiency roll-off compared to Comparative Example 3 without an interlayer, and the voltage is increased to a acceptable degree, which proves that the interlayer can enlarge the distribution region of the excitons and act to block the excitons. In addition, comparing the three organic light emitting devices in Example 3, it can be seen that the thickness of the fluorescent layer also affects the efficiency roll-off, and the organic light emitting device has an optimal performance when the thickness is 0.5 nm, indicating that this thickness is within the optimal thickness range.

It should be understood by those of ordinary skill in the art that the above discussion of any of the embodiments above is merely exemplary, and is not intended to imply that the scope of the disclosure (including the claims) is limited to these embodiments. The above embodiments, or the technical features in different embodiments, can also be combined, and the steps thereof can be performed in any order, within the concept of the present disclosure. There may be many other variations of the different aspects of one or more of the embodiments of the present disclosure as described above, which are not provided in detail for the sake of brevity.

The embodiment(s) of the present disclosure are intended to encompass all such alterations, modifications and variations that fall within the broad scope of the appended claims. Therefore, any omissions, modifications, equivalents, improvements, and the like, which may be made within the spirit and principles of one or more embodiment of the present disclosure, shall be encompassed within the scope of the present disclosure.

What is claimed is:

1. An organic light emitting device, comprising a p-type host layer, an n-type host layer, and an interlayer disposed between the p-type host layer and the n-type host layer, wherein
   at least one of the p-type host layer and the n-type host layer comprises a fluorescent dopant, and a preset distance is present between the fluorescent dopant and the interlayer;
   the p-type host layer and the n-type host layer are configured to form, together with the interlayer, a spatially separated exciplex under an action of driving voltage; and
   the fluorescent dopant is configured to absorb energy of singlet excitons generated by the exciplex to emit light.

2. The organic light emitting device according to claim 1, wherein a thickness of the interlayer ranges from 1 nm to 20 nm.

3. The organic light emitting device according to claim 1, wherein the interlayer comprises a bipolar material with balanced transport between electrons and holes.

4. The organic light emitting device according to claim 3, wherein the bipolar material comprises a carbazole-azine derivative, and the carbazole-azine derivative comprises one or more substituents independently selected from a dibenzo-heteroatom five-membered ring or fluorene.

5. The organic light emitting device according to claim 1, wherein a p-type host material of the p-type host layer comprises at least one of carbazole, dibenzothiphene, dibenzofuran, aromatic amine, or fluorene.

6. The organic light emitting device according to claim 1, wherein an n-type host material of the n-type host layer comprises an azine derivative, and the azine derivative comprises one or more substituents independently selected from a dibenzo-heteroatom five-membered ring, fluorene, benzene ring, or biphenyl.

7. The organic light emitting device according to claim 1, wherein a photoluminescence spectrum of a mixed film layer prepared from a p-type host material of the p-type host layer and an n-type host material of the n-type host layer, and an ultraviolet absorption spectrum of the fluorescent dopant, have an overlapping area with a proportion of greater than or equal to 50%.

8. The organic light emitting device according to claim 1, wherein the preset distance ranges from 3 nm to 10 nm.

9. The organic light emitting device according to claim 1, wherein the fluorescent dopant is configured to form at least one of a doped region and a fluorescent layer.

10. The organic light emitting device according to claim 9, wherein a thickness of the fluorescent layer ranges from 0.1 nm to 1.5 nm.

11. The organic light emitting device according to claim 1, wherein energy levels of a p-type host material of the p-type host layer, an n-type host material of the n-type host layer, an interlayer material, and the fluorescent dopant satisfy the following conditions:

$$|HOMO|_{(n-type)} - |LUMO|_{(p-type)} \geq 4 \text{ eV},$$

$$|HOMO|_{(p-type)} - |LUMO|_{(n-type)} \leq 3 \text{ eV},$$

$$|HOMO|_{(p-type\ \&\ n-type)} \leq |HOMO|_{(fluorescent\ dopant)},$$

$$|LUMO|_{(fluorescent\ dopant)} \leq |LUMO|_{(p-type\ \&\ n-type)},$$

$$|HOMO|_{(p-type)} < |HOMO|_{(interlayer)} < |HOMO|_{(n-type)},$$

$$|LUMO|_{(p-type)} < |LUMO|_{(interlayer)} < |LUMO|_{(n-type)},$$

$$S1_{(fluorescent\ dopant)} < S1_{(p-type\ \&\ n-type)}, \text{ and}$$

$$T1_{(fluorescent\ dopant)} < T1_{(p-type\ \&\ n-type)};$$

wherein, $|HOMO|_{(n-type)}$ corresponds to a HOMO energy level of the n-type host material, and $|LUMO|_{(n-type)}$ corresponds to a LUMO energy level of the n-type host material;

$|HOMO|_{(p-type)}$ corresponds to a HOMO energy level of the p-type host material, and $|LUMO|_{(p-type)}$ corresponds to a LUMO energy level of the p-type host material;

$|HOMO|_{(interlayer)}$ corresponds to a HOMO energy level of the interlayer material, and $|LUMO|_{(interlayer)}$ corresponds to a LUMO energy level of the interlayer material;

$|HOMO|_{(fluorescent\ dopant)}$ corresponds to a HOMO energy level of the fluorescent dopant, and $|LUMO|_{(fluorescent\ dopant)}$ corresponds to a LUMO energy level of the fluorescent dopant;

$|HOMO|_{(p-type\ \&\ n-type)}$ corresponds to a HOMO energy level of an exciplex formed from the n-type host material and the p-type host material;

$|LUMO|_{(p-type\ \&\ n-type)}$ corresponds to a LUMO energy level of an exciplex formed from the n-type host material and the p-type host material;

$S1_{(fluorescent\ dopant)}$ corresponds to energy of a singlet exciton of the fluorescent dopant;

$T1_{(fluorescent\ dopant)}$ corresponds to energy of a triplet exciton of the fluorescent dopant;

$S1_{(p-type\ \&\ n-type)}$ corresponds to energy of a singlet exciton of the exciplex formed from the n-type host material and the p-type host material; and $T1_{(p-type\ \&\ n-type)}$ corresponds to energy of a triplet exciton of the exciplex formed from the n-type host material and the p-type host material.

12. The organic light emitting device according to claim 1, wherein the organic light emitting device further comprises a hole transport layer, a hole injection layer and an anode that are sequentially disposed on a side of the p-type host layer distal from the interlayer, and an electron transport layer, an electron injection layer, and a cathode that are sequentially disposed on a side of the n-type host layer distal from the interlayer.

13. A method of manufacturing an organic light emitting device, the method comprising:
providing a substrate; and
sequentially forming a p-type host layer, an interlayer, and an n-type host layer on the substrate,
wherein at least one of the p-type host layer and the n-type host layer comprises a fluorescent dopant, and a preset distance is present between the fluorescent dopant and the interlayer;
the p-type host layer and the n-type host layer are configured to form, together with the interlayer, a spatially separated exciplex under an action of driving voltage; and
the fluorescent dopant is configured to absorb energy of singlet excitons generated by the exciplex to emit light.

14. The method according to claim 13, sequentially forming the p-type host layer, the interlayer, and the n-type host layer on the substrate, comprises:
forming a first sub-layer of p-type host material comprising a fluorescent dopant on the substrate;
forming a second sub-layer of p-type host material on the first sub-layer of p-type host material; and
sequentially forming the interlayer and the n-type host layer on the second sub-layer of p-type host material.

15. The method according to claim 14, wherein a thickness of the second sub-layer of p-type host material matches the preset distance.

16. The method according to claim 13, sequentially forming the p-type host layer, the interlayer, and the n-type host layer on the substrate, comprises:
sequentially forming the p-type host layer and the interlayer on the substrate;
forming a second sub-layer of n-type host material on the interlayer; and forming a first sub-layer of n-type host material comprising a fluorescent dopant on the second sub-layer of n-type host material.

17. The method according to claim 16, wherein a thickness of the second sub-layer of n-type host material matches the preset distance.

18. The method according to claim 13, wherein a thickness of the interlayer ranges from 1 nm to 20 nm.

19. The method according to claim 14, wherein the substrate comprises an anode, a hole injection layer, and a hole transport layer that are stacked; and the method further comprises:
   sequentially forming an electron transport layer, an electron injection layer and a cathode on the n-type host layer.

20. A display panel, comprising a substrate, and a plurality of organic light emitting devices disposed on the substrate, wherein each of the plurality of organic light emitting devices comprises a p-type host layer, an n-type host layer, and an interlayer disposed between the p-type host layer and the n-type host layer;
   at least one of the p-type host layer and the n-type host layer comprises a fluorescent dopant, and a preset distance is present between the fluorescent dopant and the interlayer;
   the p-type host layer and the n-type host layer are configured to form, together with the interlayer, a spatially separated exciplex under an action of driving voltage; and
   the fluorescent dopant is configured to absorb energy of singlet excitons generated by the exciplex to emit light.

* * * * *